United States Patent
Jo et al.

(10) Patent No.: US 11,321,959 B2
(45) Date of Patent: May 3, 2022

(54) ELECTRONIC APPARATUS IN WHICH CONDUCTIVE MEMBER FOR BLOCKING NOISE GENERATED BY DISPLAY IS DISPOSED BETWEEN DISPLAY AND ULTRASONIC SENSOR

(71) Applicant: Samsung Electronics Co., Ltd., Suwon-si (KR)

(72) Inventors: Jeonggyu Jo, Suwon-si (KR); Bongjae Rhee, Suwon-si (KR); Joohan Kim, Suwon-si (KR); Bokyung Sim, Suwon-si (KR); Yongwon Lee, Suwon-si (KR); Daekwang Jung, Suwon-si (KR); Chihyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 211 days.

(21) Appl. No.: 16/768,740

(22) PCT Filed: Dec. 5, 2018

(86) PCT No.: PCT/KR2018/015305
§ 371 (c)(1),
(2) Date: Jun. 1, 2020

(87) PCT Pub. No.: WO2019/112314
PCT Pub. Date: Jun. 13, 2019

(65) Prior Publication Data
US 2021/0174044 A1      Jun. 10, 2021

(30) Foreign Application Priority Data

Dec. 6, 2017 (KR) .................. 10-2017-0166559

(51) Int. Cl.
*G06V 40/13* (2022.01)
*G06F 1/16* (2006.01)
(Continued)

(52) U.S. Cl.
CPC ........ *G06V 40/1306* (2022.01); *G06F 1/1626* (2013.01); *G06F 1/1656* (2013.01);
(Continued)

(58) Field of Classification Search
CPC .. G06V 40/1306; G06V 10/17; G06F 1/1626; G06F 1/1656; G06F 1/1637;
(Continued)

(56) References Cited

U.S. PATENT DOCUMENTS 9,577,318 B2    2/2017   Pascolini et al.
10,122,071 B2   11/2018  Pascolini et al.
(Continued)

FOREIGN PATENT DOCUMENTS

CN      106037801 A    10/2016
CN      107170360 A    9/2017
(Continued)

OTHER PUBLICATIONS

Extended European Search Report dated on Nov. 13, 2020, issued in European Application No. 18886956.4.

*Primary Examiner* — Abhishek Sarma
(74) *Attorney, Agent, or Firm* — Jefferson IP Law, LLP

(57) ABSTRACT

Disclosed is an electronic device. The electronic device according to an embodiment includes a display panel including a plurality of pixels, a display driver IC that is electrically connected with the display panel and that displays contents using the plurality of pixels, a support structure disposed under one surface of the display panel and having an opening part formed therein through which a partial area of the one surface is exposed, a shielding structure disposed
(Continued)

under at least part of the partial area of the display exposed through the opening part, the shielding structure being electrically connected with a ground area provided in the electronic device so as to block noise generated from the display panel driven by the display driver IC, and an ultrasonic sensor disposed under at least part of the shielding structure. Besides, it may be permissible to prepare various other embodiments speculated through the specification.

15 Claims, 16 Drawing Sheets

(51) Int. Cl.
    *H05K 1/02*         (2006.01)
    *G09G 3/20*         (2006.01)
    *H05K 9/00*         (2006.01)

(52) U.S. Cl.
    CPC .............. *G09G 3/20* (2013.01); *H05K 1/0216* (2013.01); *H05K 9/0024* (2013.01); *H05K 9/0054* (2013.01)

(58) Field of Classification Search
    CPC ...... G06F 1/1658; G09G 3/20; H05K 1/0216; H05K 9/0024; H05K 9/0054; H05K 1/02; H05K 9/0088; H05K 9/0092; H05K 1/0218; G01H 17/00; G02F 1/1333
    See application file for complete search history.

(56) References Cited

U.S. PATENT DOCUMENTS

| | | | |
|---|---|---|---|
| 10,198,611 | B2 | 2/2019 | Evans, V et al. |
| 10,223,571 | B2 | 3/2019 | Evans, V et al. |
| 10,261,549 | B2 | 4/2019 | Han et al. |
| 2011/0304564 | A1 | 12/2011 | Kim et al. |
| 2013/0127783 | A1 | 5/2013 | Lee et al. |
| 2014/0352440 | A1 | 12/2014 | Fennell et al. |
| 2014/0355376 | A1 | 12/2014 | Schneider et al. |
| 2016/0246396 | A1 | 8/2016 | Dickinson et al. |
| 2017/0124372 | A1 | 5/2017 | Evans, V et al. |
| 2017/0212613 | A1 | 7/2017 | Hwang et al. |
| 2017/0300736 | A1* | 10/2017 | Song .................. G06V 40/1312 |
| 2017/0367679 | A1 | 12/2017 | Wang |
| 2019/0187760 | A1 | 6/2019 | Han et al. |
| 2019/0303640 | A1 | 10/2019 | Song et al. |

FOREIGN PATENT DOCUMENTS

| | | |
|---|---|---|
| KR | 10-2011-0135301 A | 12/2011 |
| KR | 10-2017-0020148 A | 2/2017 |
| KR | 10-2017-0031217 A | 3/2017 |
| KR | 10-2017-0087635 A | 7/2017 |
| KR | 10-1796660 B1 | 11/2017 |
| TW | 201709012 A | 3/2017 |

\* cited by examiner

ELECTRONIC APPARATUS IN WHICH CONDUCTIVE MEMBER FOR BLOCKING NOISE GENERATED BY DISPLAY IS DISPOSED BETWEEN DISPLAY AND ULTRASONIC SENSOR

TECHNICAL FIELD

Embodiments of the disclosure described herein relate to a technology for mounting an ultrasonic sensor in an electronic device.

BACKGROUND ART

An electronic device (e.g., a smartphone, a wearable device, a tablet PC, a notebook computer, or the like) may include a display. The display may serve as a display unit and an input unit. The display included in the electronic device tends to increase in size according to user demands. Accordingly, the display may occupy a large portion of the front of the electronic device.

The electronic device may be equipped with a sensor for obtaining a user's biometric information (e.g., a fingerprint, an iris, or the like). For example, the sensor for measuring biometric information may be implemented in various types such as an optical type, a capacitive type, and the like. In recent years, ultrasonic sensors for measuring biometric information using ultrasonic waves have been used.

DISCLOSURE

Technical Problem

The electronic device may be equipped with an ultrasonic sensor for obtaining the user's biometric information. A housing of the electronic device may be formed of a material having stiffness, such as plastic or metal. Accordingly, when mounted in the electronic device, the ultrasonic sensor may be mounted to be exposed to the outside through an opening of the housing so as to transmit and receive ultrasonic signals. Due to this, the user's esthetic sense for the electronic device may be decreased, and a separate process of forming the opening in the housing may be required.

The ultrasonic signals of the ultrasonic sensor may be transmitted through the display of the electronic device. At least part of the display is exposed to the outside through the housing. Accordingly, when the ultrasonic sensor is mounted under the display of the electronic device, the ultrasonic sensor may obtain the user's biometric information using the ultrasonic signals transmitted and received through the display.

Embodiments of the disclosure provide a structure for disposing an ultrasonic sensor below a display of an electronic device, and an electronic device having the structure.

Technical Solution

An electronic device according to an embodiment of the disclosure includes a display panel including a plurality of pixels, a display driver IC that is electrically connected with the display panel and that displays contents using the plurality of pixels, a support structure that is disposed under one surface of the display panel and that has an opening part formed therein through which a partial area of the one surface is exposed, a shielding structure disposed under at least part of the partial area of the display panel exposed through the opening part, the shielding structure being electrically connected with a ground area provided in the electronic device so as to block noise generated from the display panel driven by the display driver IC, and an ultrasonic sensor disposed under at least part of the shielding structure.

Furthermore, an electronic device according to an embodiment of the disclosure includes a housing, a display panel that is disposed in the housing and that includes a plurality of pixels, a support structure that is disposed under the display panel and that has an opening part formed in a partial area thereof, an ultrasonic sensor that transmits and receives an ultrasonic signal passing through the display panel, a shielding structure that is disposed in the opening part and is disposed between the display panel and the ultrasonic sensor and that contains a conductive material, and a ground area provided in the housing. The shielding structure is electrically connected with the ground area.

In addition, an electronic device according to an embodiment of the disclosure includes a display panel including at least one pixel, a conductive member that is disposed under the display panel and that blocks noise generated from the display panel in relation to driving of the at least one pixel, a biometric sensor disposed under the conductive member, and a thin layer that absorbs external light incident through the display panel, the thin layer being disposed between the display panel and the conductive member.

Advantageous Effects

According to the embodiments of the disclosure, display-induced noise that is likely to affect the performance of the ultrasonic sensor when the ultrasonic sensor is mounted under the display of the electronic device may be blocked.

Furthermore, according to the embodiments of the disclosure, the inside of the electronic device may be prevented from being visible through the area of the display where the ultrasonic sensor is mounted.

Moreover, according to the embodiments of the disclosure, a flexural phenomenon that is likely to occur when internal parts including the display are cured may be prevented.

In addition, the disclosure may provide various effects that are directly or indirectly recognized.

MODE FOR INVENTION

Figure 1:
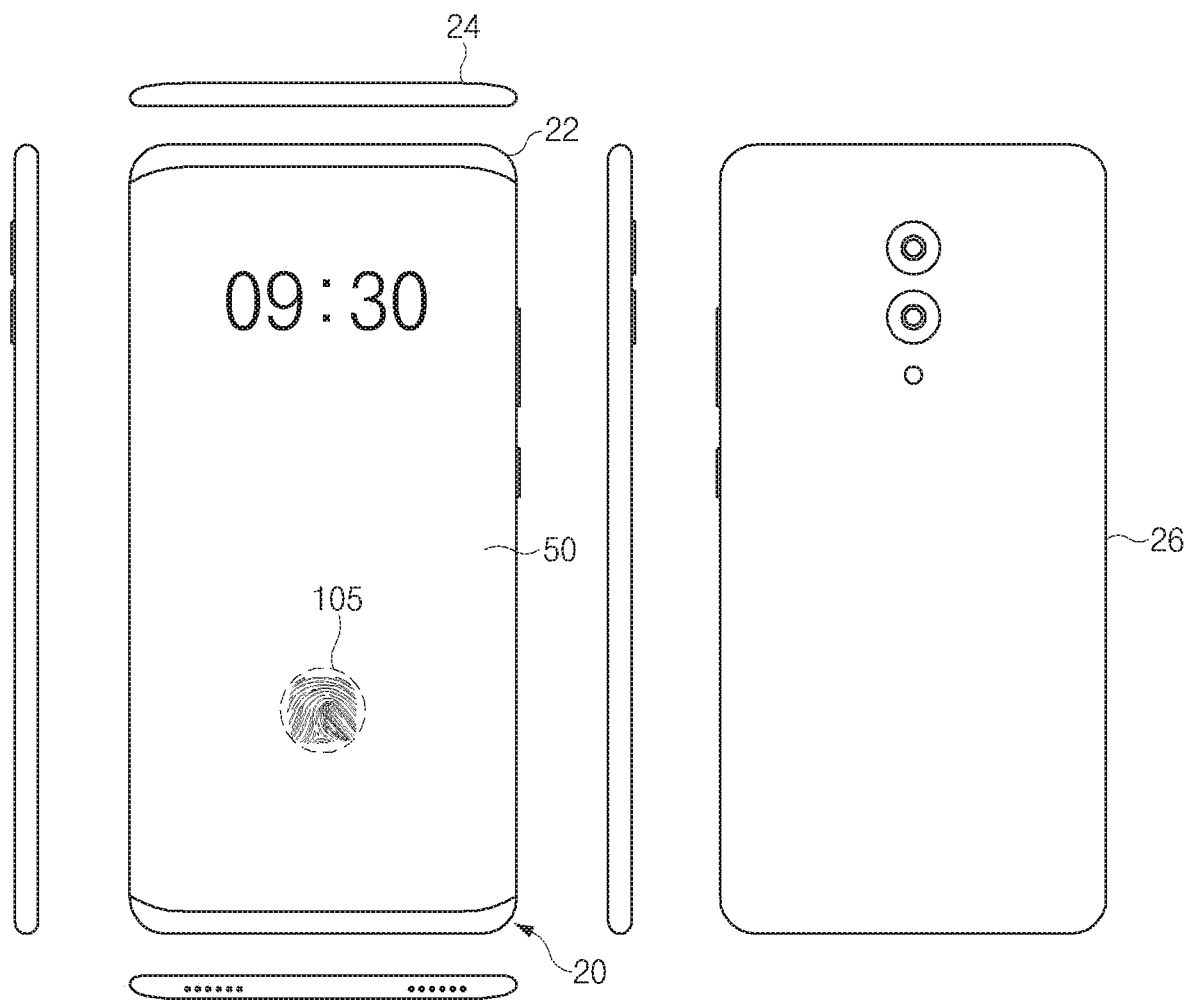
FIG. 1 illustrates six orthogonal views of an electronic device according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when an component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the disclosure may not be limited to the above-described electronic devices and may include other electronic devices and new electronic devices according to the development of technologies.

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

FIG. 1 illustrates six orthogonal views of an electronic device according to an embodiment.

Referring to FIG. 1, the electronic device 10 according to the embodiment may include a display 50 and a housing 20. The housing 20 may include a front surface 22, a rear surface 26 opposite to the front surface 22, and side surfaces 24 that surround a space between the front surface 22 and the rear surface 26. At least part of the display 50 may be exposed through the front surface 22 of the housing 20. The display 50 may occupy substantially the entire front surface 22 of the electronic device 10.

In an embodiment, an ultrasonic sensor may be disposed under a partial area 105 of the display 50. For example, when the ultrasonic sensor is a fingerprint sensor, a user may touch a finger to the partial area 105 of the display 50 and may perform fingerprint recognition.

Figure 2:
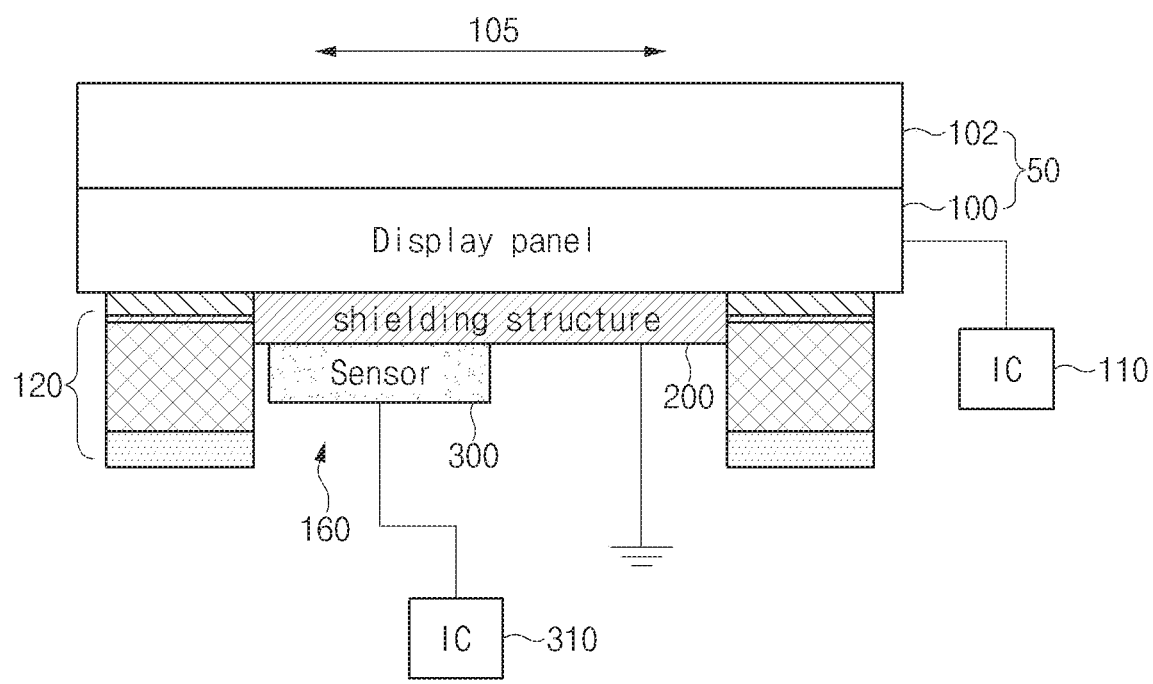
FIG. 2 is a sectional view of the electronic device according to an embodiment.

FIG. 2 is a sectional view of the electronic device according to an embodiment.

Referring to FIG. 2, the electronic device 10 may include the display 50, a support structure 120, a shielding structure 200, and an ultrasonic sensor 300. For example, the electronic device 10 may include a display driver IC (DDI) 110 for controlling a display panel 100 and a sensor IC 310 for controlling the ultrasonic sensor 300.

In an embodiment, the display 50 may include a transparent member 102 and the display panel 100.

In an embodiment, the transparent member 102 (e.g., a glass window) may transmit light generated by the display panel 100. Furthermore, the user may perform a touch by touching a part (e.g., a finger) of the user's body to the transparent member 102. For example, the transparent member 102 may be formed of reinforced glass, reinforced plastic, a flexible polymer material, or the like. For example, the user may touch a finger to the partial area 105 of the transparent member 102 and may perform fingerprint recognition.

In an embodiment, a plurality of interconnection wires and a plurality of pixels may be disposed on the display panel 100. For example, a plurality of gate lines and a plurality of data lines may be disposed on the display panel 100, and the gate lines and the data lines may cross each other. The pixels may emit light, based on signals supplied from the gate lines and the data lines.

The plurality of pixels disposed on the display panel 100 may be electrically connected with the display driver IC 110. The plurality of pixels may emit light, based on signals received from the display driver IC 110. Accordingly, various types of contents (e.g., a photo, a video, and the like) may be output through the display panel 100.

In an embodiment, the electronic device 10 may include the support structure 120 for supporting the display panel 100. The support structure 120 may be disposed under the display panel 100. For example, the support structure 120 may be attached to a lower surface of the display panel 100.

In an embodiment, the electronic device 10 may include the shielding structure 200 and the ultrasonic sensor 300 disposed under the shielding structure 200. Ultrasonic signals of the ultrasonic sensor 300 may be transmitted and received through the display 150. The shielding structure 200 may block noise generated from the display panel 100 that is driven by the display driver IC 110.

In an embodiment, the support structure 120 may have an opening through which a lower portion of the partial area 105 of the display panel 100 is exposed. For example, the ultrasonic sensor 300 may be disposed in an empty space 160 (Hereinafter, the empty space may be referred to as an opening part.) that is formed due to the opening of the support structure 120. The ultrasonic signals may be transmitted and received by passing through the partial area 105 of the display 50 that corresponds to the opening. Under the partial area 105 of the display 50, the support structure 120 may be removed, and the opening part 160 may be formed. Accordingly, the ultrasonic signals may be transmitted and received without being obstructed by the support structure 120.

In an embodiment, the shielding structure 200 may be disposed under the partial area 105 of the display panel 100. For example, the shielding structure 200 may contain a metallic material. The shielding structure 200 may block noise generated from the display panel 100 that is driven by the display driver IC 110.

In an embodiment, the shielding structure 200 may be electrically connected to a ground area included in the electronic device 10. For example, the ground area may be provided on any one circuit board of a circuit board (e.g., a PCB or an FPCB) on which the display driver IC 110 or the sensor IC 310 is disposed and a main circuit board.

Figure 3A:
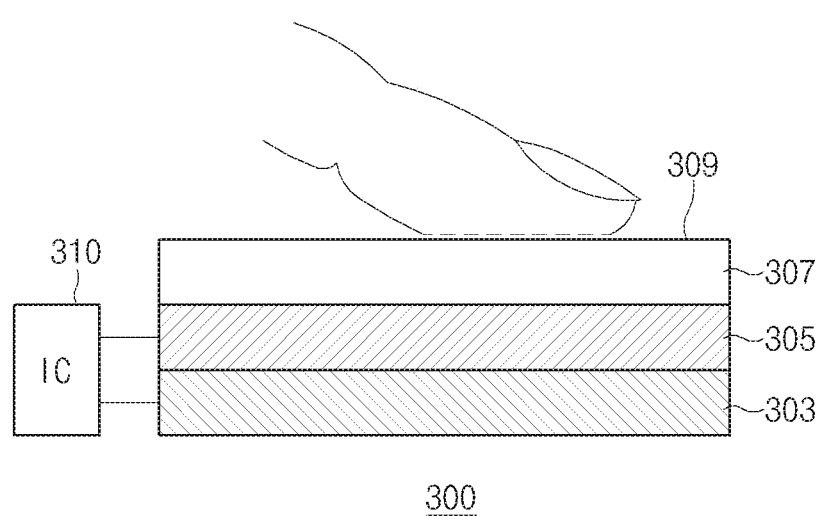
FIG. 3A is a schematic view of an ultrasonic sensor according to various embodiments.

FIG. 3A is a schematic view of the ultrasonic sensor according to various embodiments.

Referring to FIG. 3A, the ultrasonic sensor 300 according to various embodiments may include, under a platen 309, an ultrasonic transmitter 303 and an ultrasonic receiver 305. In various embodiments, the ultrasonic transmitter 303 and the ultrasonic receiver 305 may be implemented as separate layers, or may be integrated into a single layer. Referring to FIG. 3A, the ultrasonic sensor 300 in which the ultrasonic transmitter 303 and the ultrasonic receiver 305 are implemented as two layers is exemplified. In the following description, it will be exemplified that the ultrasonic sensor 300 is a fingerprint sensor. A finger of the user may be placed on the platen 309. For example, the platen 309 may be referred to as the display 50 of FIG. 2. The ultrasonic transmitter 303 may generate ultrasonic signals that move to an exposed surface 342 of the platen 309 through the ultrasonic receiver 305.

For example, the ultrasonic signals generated from the ultrasonic transmitter 303 may be transmitted to valleys between fingerprint ridges of the finger brought into contact with the platen 309 while moving on the platen 309. The transmitted ultrasonic signals may be reflected toward the ultrasonic receiver 305.

In various embodiments, the sensor IC 310 may be electrically connected with the ultrasonic transmitter 303 and the ultrasonic receiver 305. The sensor IC 310 may supply, to the ultrasonic transmitter 303, timing signals that cause the ultrasonic transmitter 303 to generate ultrasonic signals.

In various embodiments, the sensor IC 310 may convert the reflected signals into digital values that represent the strengths of the reflected signals. The sensor IC 310 may receive the signals reflected from the distributed area where the user's finger is located. The digital values representing the signal strengths in the distributed area may be converted into an image. For example, the detected signal strengths may be mapped on a contour map of the finger that represents the depths of the fingerprint ridges. The sensor IC 310 may configure a digital image of the fingerprint, which is a contact target, by using the digital values. Furthermore, the sensor IC 310 may detect a movement of a target by continuously sampling output signals with the passage of time. In various embodiments, the ultrasonic sensor 300 may be used as a sensor for recognizing another type of biometric information other than the fingerprint sensor.

Figure 3B:
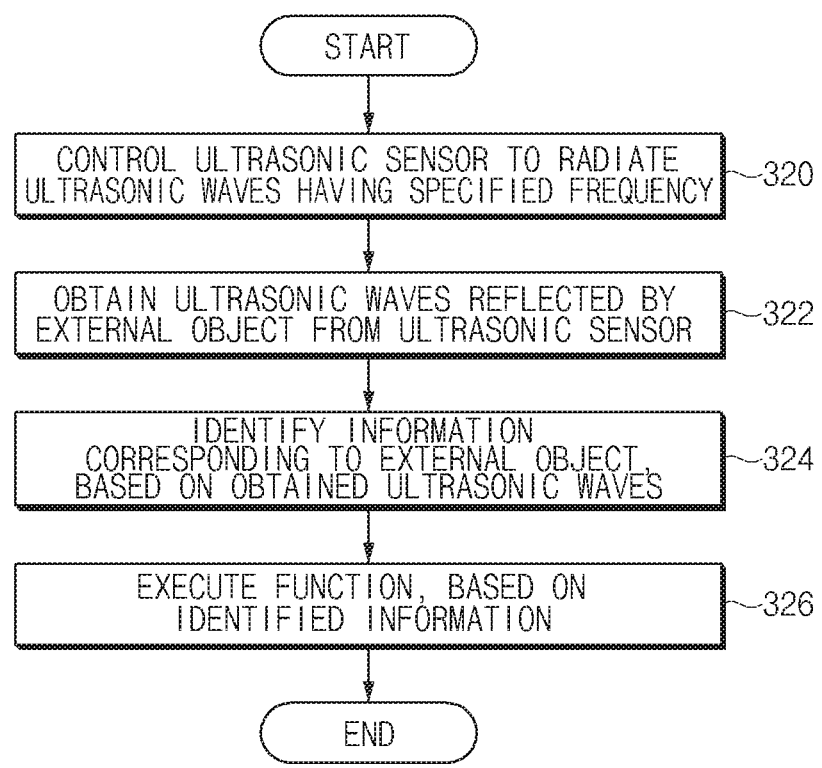
FIG. 3B illustrates an operating sequence of the electronic device using the ultrasonic sensor according to various embodiments.

FIG. 3B illustrates an operating sequence of the electronic device using the ultrasonic sensor according to various embodiments.

Referring to FIG. 3B, the electronic device 10 according to various embodiments may perform operations 320 to 326 using the ultrasonic sensor 300. Operations 320 to 326 may be implemented with, for example, instructions that are performed (or, executed) by a processor of the electronic device 10 (e.g., a processor 1020 of FIG. 10). The instructions may be stored in, for example, a computer-readable storage medium or a memory of the electronic device 10 (e.g., a memory 1030 of FIG. 10).

In operation 320, the electronic device 10 may control the ultrasonic sensor 300 to radiate ultrasonic waves having a specified frequency. For example, the electronic device 10 may transmit a control signal to the sensor IC 310 to cause the ultrasonic sensor 300 to radiate the ultrasonic waves having the specified frequency. In operation 322, the electronic device 310 may obtain, from the sensor IC 310 of the ultrasonic sensor 300, the ultrasonic waves reflected by an external object.

In operation 324, the electronic device 10 may obtain information corresponding to the external object, based on the obtained ultrasonic waves. In an embodiment, the ultrasonic sensor 300 may be a fingerprint sensor. For example, the electronic device 10 may obtain fingerprint information of a user, based on the obtained ultrasonic waves. For example, the electronic device 10 may estimate pressure applied to the ultrasonic sensor 300, by using the density of the fingerprint detected based on the ultrasonic waves. The electronic device 10 may obtain pressure information including the estimated pressure value.

In operation 326, the electronic device 10 may execute various functions, based on the obtained information. In various embodiments, the electronic device 10 may perform user authentication, based on the obtained fingerprint information. For example, the obtained fingerprint information may be used to unlock the electronic device 10 or log in to a specified application (e.g., a financial application or an SNS application). In various embodiments, the electronic device 10 may perform a specified function corresponding to the estimated pressure value, based on the obtained pressure information. For example, the electronic device 10 may be configured to perform a function (e.g., telephone call or message) or an application that is previously specified to correspond to specific pressure.

Figure 4:
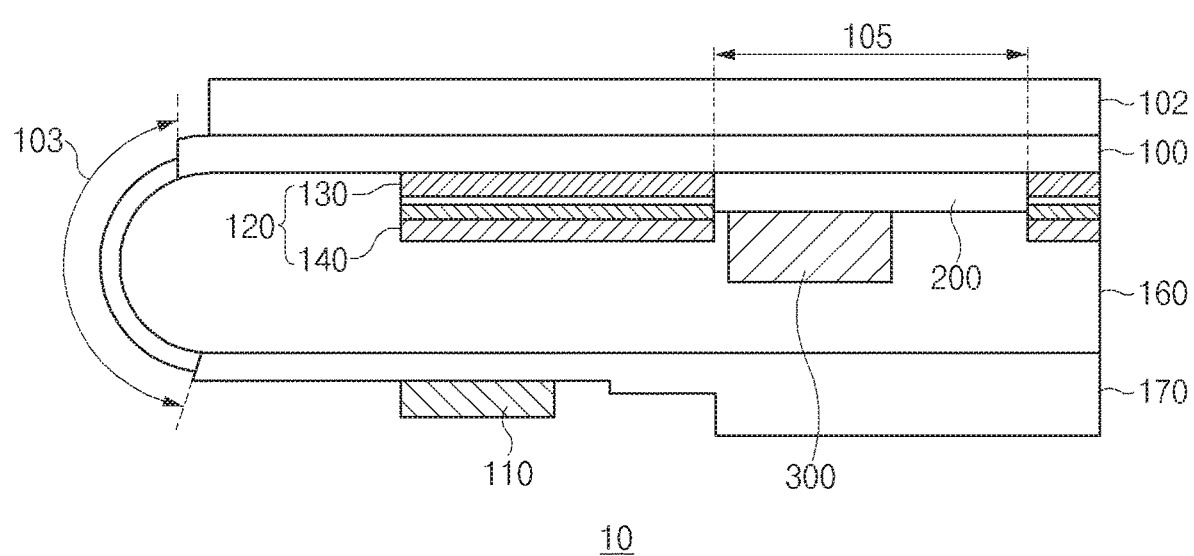
FIG. 4 is a sectional view of the electronic device according to various embodiments.

FIG. 4 is a sectional view of the electronic device according to various embodiments.

Referring to FIG. 4, the electronic device 10 according to an embodiment may include an FPCB 170 (e.g., a module FPCB) on which the display driver IC 110 is disposed. The FPCB 170 may include a ground area, and the shielding structure 200 may be electrically connected with the ground area of the FPCB 170.

In an embodiment, the electronic device 10 may further include a connecting area 103 extending from the display panel 100. The connecting area 103 may be electrically connected with the FPCB 170. According to an embodiment, the display driver IC 110 may be disposed on the connecting area 103.

For example, the connecting area 103 may be referred to as a polyimide (PI) film and a bending protect layer (BPL). For example, the PI film may include interconnection wiring for supplying electric power and/or signals to the display panel 100. The PI film may be formed of a flexible material and may extend from one end of the display to the FPCB 170. For example, the BPL may be attached to a bent area of the PI film to prevent the PI film from being cracked (or broken).

In an embodiment, the connecting area 103 may be bent such that the FPCB 170 is spaced apart from the display panel 100 and the ultrasonic sensor 300. For example, a space in which the ultrasonic sensor 300 is capable of vibrating may be formed by the connecting area 103.

FIGS. 5A to 5D are sectional views of the electronic device according to other embodiments. FIG. 5E illustrates the structure of an EMI shielding film referred to in various embodiments.

Figure 5A:
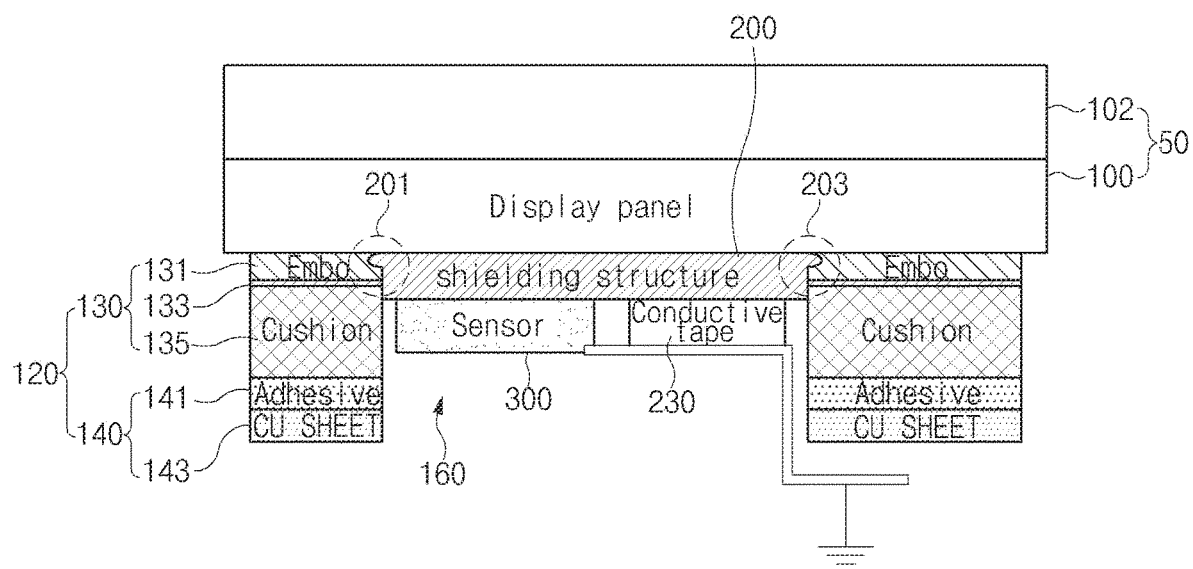
FIGS. 5A to 5D are sectional views of the electronic device according to other embodiments.
Figure 5B:
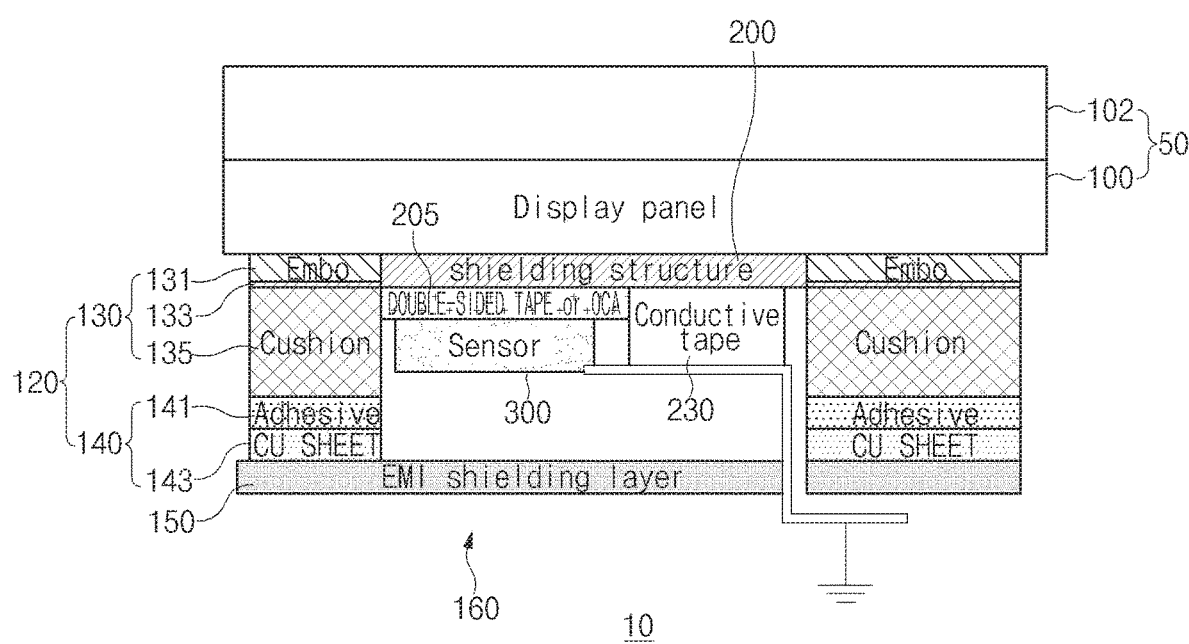
Figure 5C:
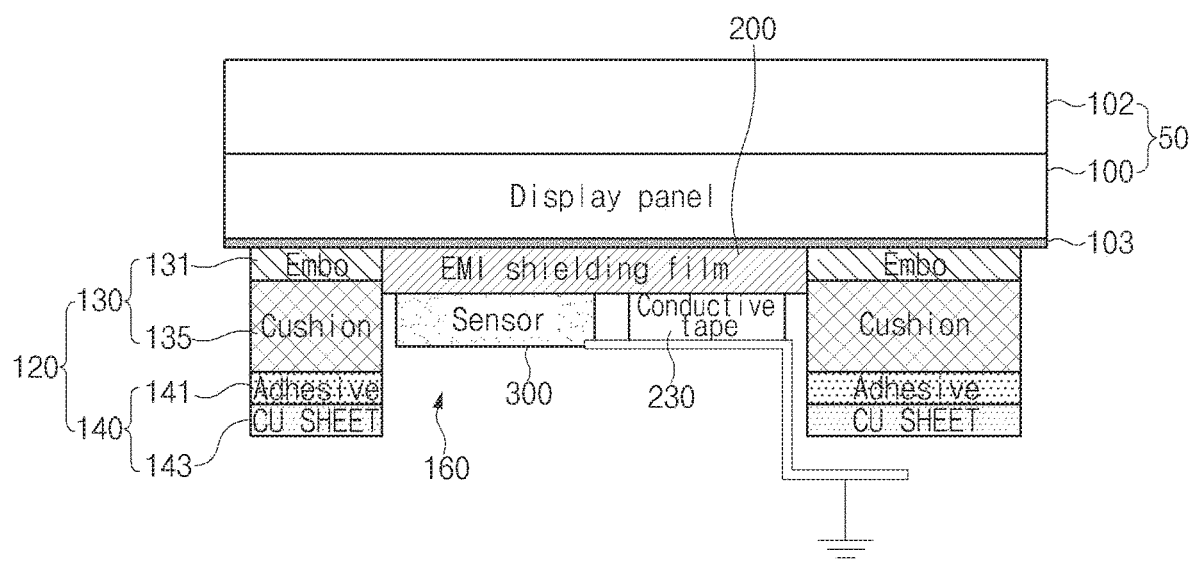
Figure 5D:
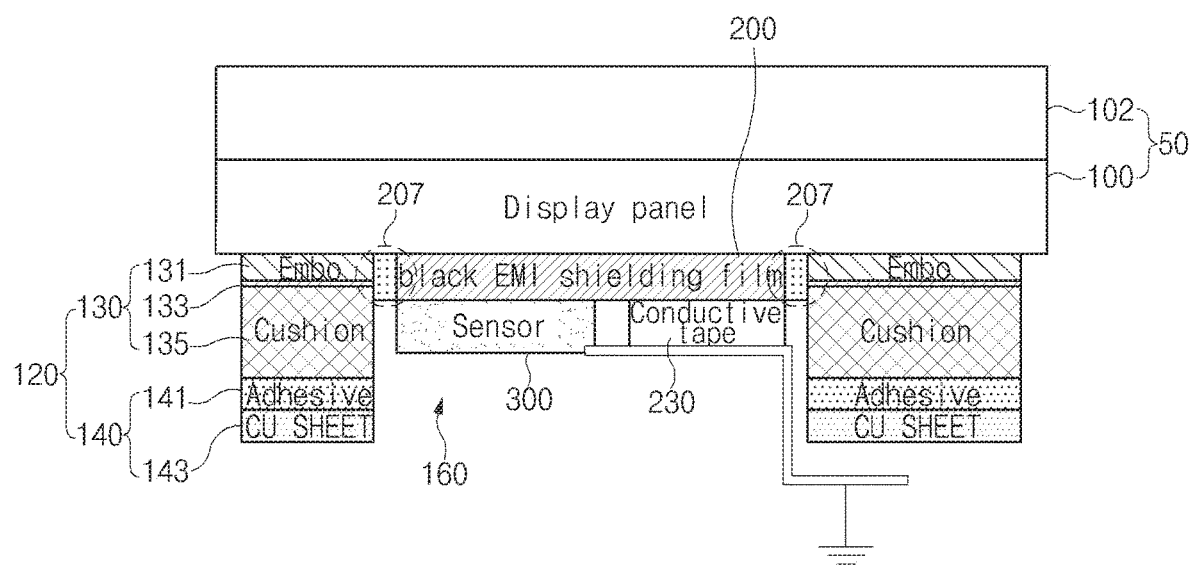
Figure 5E:
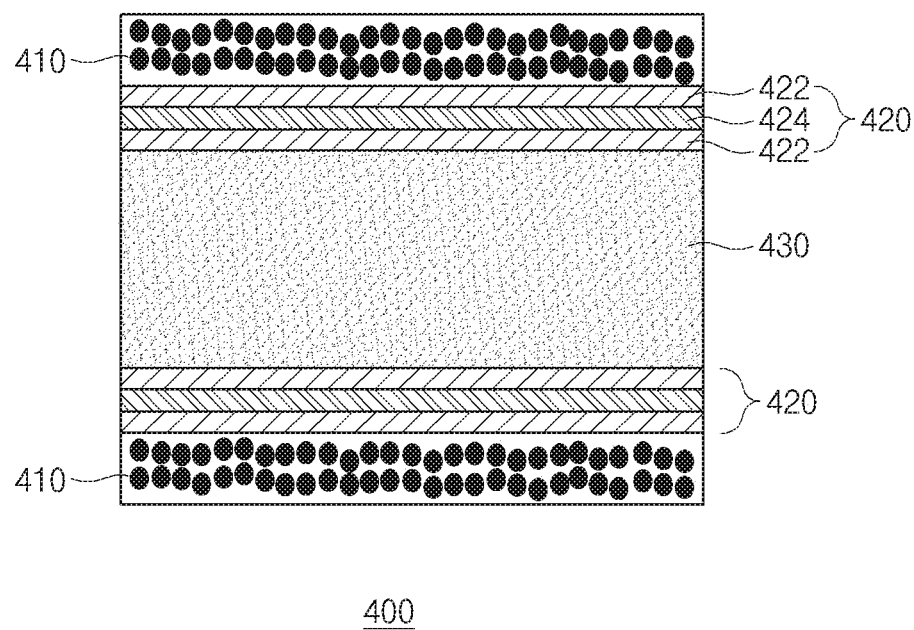
FIG. 5E illustrates the structure of an EMI shielding film referred to in various embodiments.

Referring to FIGS. 5A and 5D, the support structure 120 according to various embodiments may include a plurality of sub-layers. The support structure 120 may include a buffer sub-layer 130 disposed under the display panel 100 and a conductive sub-layer 140 disposed under the buffer sub-layer 130.

In an embodiment, the buffer sub-layer 130 may include an embo sub-layer 131 on which an embo pattern is formed, a black coating sub-layer 133, and a cushion sub-layer 135. The conductive sub-layer 140 may include an adhesive sub-layer 141 and a metal sub-layer 143 (e.g., a copper (Cu) sheet). For example, the cushion sub-layer 135 may be formed to a thickness required for a step with the embo sub-layer 131 and the conductive sub-layer 140.

For example, the embo sub-layer 131 may have a structure that is uneven and contains bubbles. Accordingly, when the ultrasonic sensor 300 is disposed under the embo sub-layer 131, the performance of the ultrasonic sensor 300 may be degraded due to distortion generated as ultrasonic signals pass through the embo sub-layer 131. The support structure 120 of the electronic device according to an embodiment may have the opening part 160 formed therein such that ultrasonic signals do not pass through the embo sub-layer 131.

In an embodiment, the black coating sub-layer 133 may prevent internal parts from being visible from outside the display 50. Under the partial area 105 of the display 50, the black coating sub-layer 133 may be removed due to the opening part 160. Accordingly, the internal parts of the electronic device 10 may be visible from outside the partial area 105 of the display 50. The shielding structure 200 may be disposed under the partial area 105 to prevent the internal parts from being visible from outside the partial area 105.

In various embodiments, the shielding structure 200 may be referred to as an electromagnetic interference (EMI) shielding film. The EMI shielding film may block noise generated from the display panel 100 and may prevent the inside of the electronic device 10 from being visible. Referring to FIG. 5E, the EMI shielding film 400 according to an embodiment may include pressure sensitive adhesive (PSA)

layers 410, at least one metal layer 420, and a fabric layer 430. The EMI shielding film 400 may be attached to the display panel 100 and the ultrasonic sensor 300 by the pressure sensitive adhesive layers 410. For example, the at least one metal layer 420 may include nickel (Ni) layers 422 and a copper (Cu) layer 424. The at least one metal layer 420 may block noise generated by the display panel 100. For example, the pressure sensitive adhesive layers 410 may contain metal powder (e.g., Ni powder). The metal powder may improve an effect of blocking noise.

In an embodiment, the EMI shielding film 400 may include the fabric layer 430. For example, the EMI shielding film 400 may be referred to as a fiber film implemented with a nano structure. For example, the fabric layer 430 may contain fibers, and the fibers may be formed thin and long by electro-spinning. The fibers may be plated with copper, may be plated with nickel after plated with copper, and may pass through a plating process of being plated with copper again. The fabric layer 430 may have a structure formed by stacking the plurality of fibers formed by the plating process. The structure may be referred to as a nano structure. Due to the nano structure, the EMI shielding film 400 may have a shielding force against electromagnetic waves.

In an embodiment, the at least one metal layer 420 may have a small thickness due to a plating method. For example, the at least one metal layer 420 may be designed to have a thickness of about 1 micrometer (m) or less. In this case, the nickel layers 422 and the copper layer 424 may have a thickness of about 0.3 micrometers. For example, the fabric layer 430 may have a thickness of about 8 micrometers. The EMI shielding film may have a thickness of about 15 micrometers to about 18 micrometers.

The shielding structure 200 of the electronic device 10 according to various embodiments may include the EMI shielding film 400 illustrated in FIG. 5E.

In various embodiments, the shielding structure 200 may contain a black pigment (e.g., a black ink), a material having a shrinkage of a predetermined value or less, and a conductive material. The black pigment may prevent the inside of the electronic device 10 from being visible. The conductive material may block noise generated from the display panel 100. The material having a shrinkage of the predetermined value or less may improve a flexural phenomenon caused by shrinkage during curing.

For example, when thermosetting parts are cured, a part having a high shrinkage may attract a part having a different property, and therefore internal parts may be bent due to the curing. As the shielding structure 200 is formed of a material having a low shrinkage, such a phenomenon (hereinafter, referred to as a flexural phenomenon) may be significantly improved.

In an embodiment, a material contained in the shielding structure 200 may have a shrinkage of a predetermined value or less. The predetermined value may be a numerical value at which the flexural phenomenon does not occur, and may be experimentally determined. For example, a material having a shrinkage of less than about 2% may be selected.

In various embodiments, when the shielding structure 200 includes the EMI shielding film, denaturation of the EMI shielding film at high temperature may have an influence on the performance of the ultrasonic sensor 300. However, the shielding structure 200 of a thermosetting material is not denatured at high temperature, and therefore the ultrasonic sensor 300 may maintain predetermined performance even at high temperature.

In various embodiments, the black coating sub-layer 133 may be formed by being connected with the shielding structure 200. For example, referring to areas 201 and 203, the black pigment may be applied to side surfaces of the embo sub-layer 131 and the cushion sub-layer 135. As the black pigment fills the clearance between the shielding structure 200 and the support structure 120, the inside of the electronic device 10 may be prevented from being visible.

In various embodiments, the shielding structure 200 may contain a black pigment, a material having a shrinkage of a predetermined value or less, a conductive material, and an adhesive material (e.g., a thermosetting resin). The ultrasonic sensor 300 may be attached to the bottom of the shielding structure 200.

Referring to FIG. 5B, when the shielding structure 200 contains a conductive material, but does not contain an adhesive material, a double-sided tape or an optical clear resin (OCR) may be disposed under the shielding structure 200. For example, the optical clear resin (OCR) may be referred to as a curing adhesive. The optical clear resin may have a low shrinkage. The double-sided tape or the optical clear resin (OCR) may be referred to as an adhesive layer 205.

Referring to Table 1, it can be seen that an adhesive having a low-shrinkage property has a low coefficient of thermal expansion (CTE) and a low shrinkage, compared with a general adhesive. When the adhesive having the low-shrinkage property is used, a flexural phenomenon during curing and denaturation at high temperature may be prevented.

TABLE 1

| ITEM | UNIT | General Adhesive | Low-Shrinkage Adhesive |
|---|---|---|---|
| CTE α1 | ppm/° C. | 62 | 23 |
| α2 | ppm/° C. | 197 | 94 |
| Shrinkage | % | 4.91 | 1.66 |

For example, the adhesive layer 205 may cause the ultrasonic sensor 300 to be stuck to the shielding structure 200. In an embodiment, the adhesive layer 205 may have a narrower area than the shielding structure 200.

In various embodiments, the shielding structure 200 may be electrically connected with a ground area through a conductive tape 230. For example, the shielding structure 200 may be connected, through the conductive tape 230, with a ground area of at least one circuit board on which the display driver IC 110 or the sensor IC 310 is disposed.

Referring to FIG. 5C, a black pigment layer 103 may be disposed on a rear surface of the display panel 100 according to various embodiments. For example, a black pigment may be applied to the entire rear surface of the display panel 100. For example, the black pigment layer 103 may be referred to as a thin layer of a black pigment. In this case, the support structure 120 may not include a black layer for preventing the inside of the electronic device 10 from being visible. For example, the buffer sub-layer 130 may not include a black coating sub-layer (e.g., the black coating sub-layer 133 of FIGS. 5A and 5B).

In various embodiments, when the black pigment layer 103 is disposed on the rear surface of the display panel 100, the shielding structure 200 may be implemented with an EMI shielding film (e.g., the EMI shielding film 400 of FIG. 5E). The black pigment layer 103 may prevent the inside of the electronic device 10 from being visible. The EMI shielding film may block noise generated from the display panel 100.

Referring to FIG. 5D, the shielding structure 200 according to various embodiments may be implemented with a black EMI shielding film. The black EMI shielding film may prevent the inside of the electronic device 10 from being visible and may block noise generated from the display panel 100. In various embodiments, a black pigment may be applied to a periphery 207 of the black EMI shielding film. The applied black pigment may prevent the inside of the electronic device 10 from being visible through the clearance between the black EMI shielding film and the support structure 120.

Figure 6:
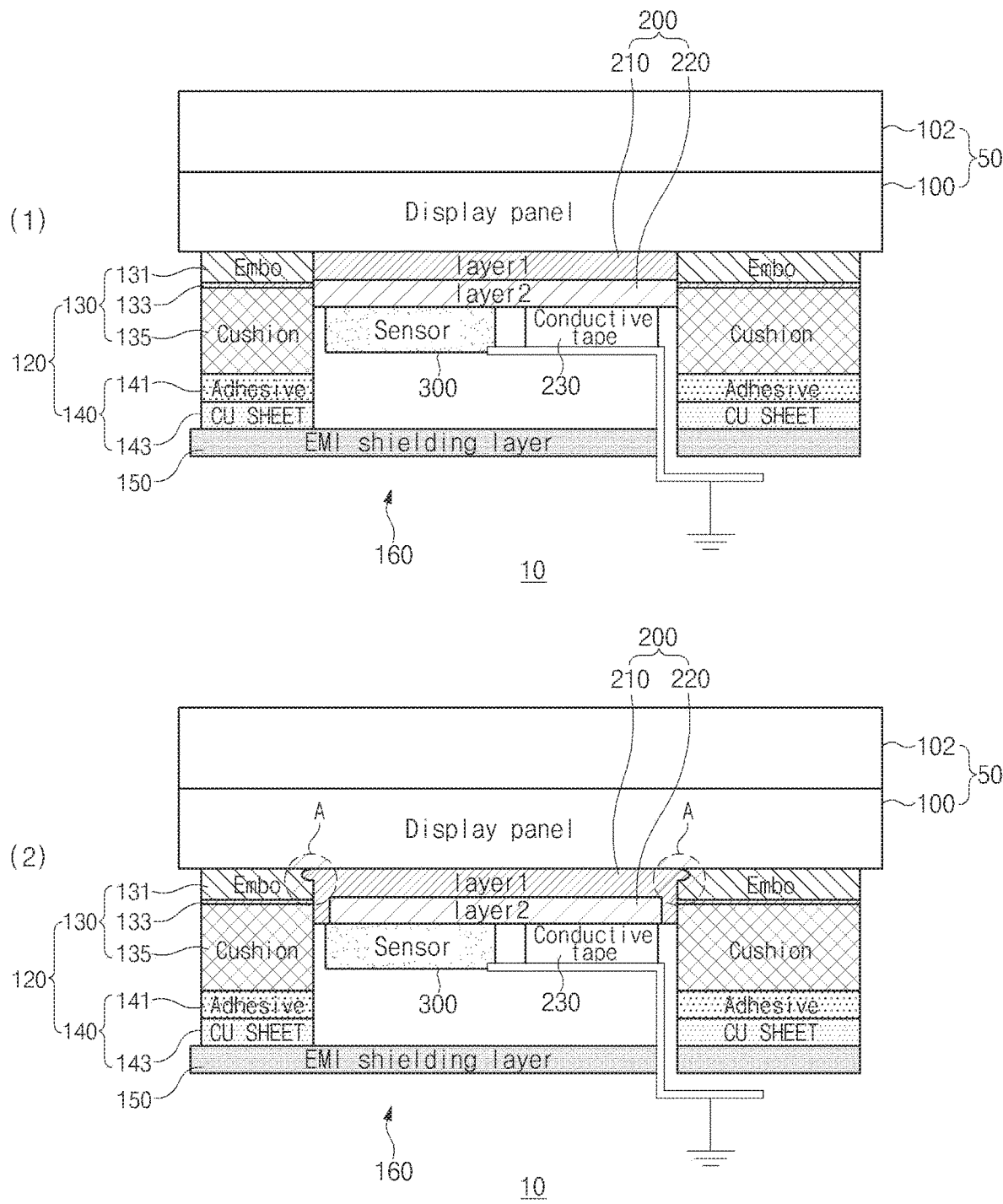
FIG. 6 illustrates sectional views of the electronic device according to other embodiments.

FIG. 6 illustrates sectional views of the electronic device according to other embodiments.

Referring to FIG. 6, the shielding structure 200 according to another embodiment may include a first layer 210 and a second layer 220 disposed under the first layer 210. For example, the shielding structure 200 may correspond to the shielding structure 200 of FIG. 5. Hereinafter, the shielding structure 200 in FIG. 6 may include the two layers.

The first layer 210 of the shielding structure 200 according to an embodiment may be referred to as a black pigment layer. The black pigment layer may absorb external light incident through the display panel 100. For example, the black pigment layer may be referred to as a thin layer containing a black pigment.

For example, the black pigment layer may be referred to as a black non-conductive ink. The black pigment layer 210 may prevent the inside of the electronic device 10 from being visible through the rear surface of the partial area 105 of the display panel 100. For example, the black non-conductive ink may be applied to the rear surface of the partial area 105 of the display panel 100 by a dispensing or spray method.

In another example, the black pigment layer may be referred to as a black conductive ink. The black conductive ink may prevent the inside of the electronic device 10 from being visible through the rear surface of the partial area 105 of the display panel 100 and may block noise generated from the display panel 100.

In an embodiment, the second layer 220 of the shielding structure 200 may be referred to as an EMI shielding film. The EMI shielding film may block noise generated from the display panel 100.

In another embodiment, the second layer 220 of the shielding structure 200 may contain a material having a shrinkage of a predetermined value or less and a conductive material. In this case, the second layer 220 may block noise generated from the display panel 100 and may prevent a flexural phenomenon that is likely to occur during curing.

In another embodiment, the second layer 220 of the shielding structure 200 may contain a non-conductive material having a shrinkage of a predetermined value or less. The second layer 220 may prevent a flexural phenomenon that is likely to occur during curing. In this case, the second layer 220 may constitute the shielding structure 200 in combination with the conductive black pigment layer. The first layer 210 of the conductive black pigment layer may have a smaller thickness than the second layer 220. The shielding structure 200 including the first layer 210 and the second layer 220 may improve the performance of the ultrasonic sensor 300 by raising an effect of blocking noise of the display panel 100 and reducing the thickness of the shielding structure 200.

In various embodiments, the second layer 220 may further contain a material having adhesiveness (e.g., a thermosetting resin). The ultrasonic sensor 300 may be fixed by being directly attached to the bottom of the second layer 220.

In various embodiments, the first layer 210 may be formed by being connected with the black coating sub-layer 133 of the support structure 120. For example, referring to area A, a black pigment may be applied to side surfaces of the embo sub-layer 131 and the cushion sub-layer 135. As the black pigment fills the first layer 210 and the clearance between the shielding structure 200 and the support structure 120, the inside of the electronic device 10 may be prevented from being visible.

In various embodiments, the shielding structure 200 may be electrically connected with a ground area through the conductive tape 230. For example, the shielding structure 200 may be connected, through the conductive tape 230, with a ground area of at least one circuit board on which the display driver IC 110 or the sensor IC 310 is disposed.

In various embodiments, the electronic device 10 may further include a shielding layer 150 disposed under the support structure 120. For example, the shielding layer 150 may be referred to as a plate containing a conductive material. The shielding layer 150 may block noise generated from the inside (e.g., a main board) of the electronic device 10 and may improve the performance of the ultrasonic sensor 300.

For example, referring to FIG. 6, the shielding layer 150 may have a hole formed therein through which a wire (e.g., a cable) for connecting the shielding structure 200 and the ground area passes.

Figure 7:
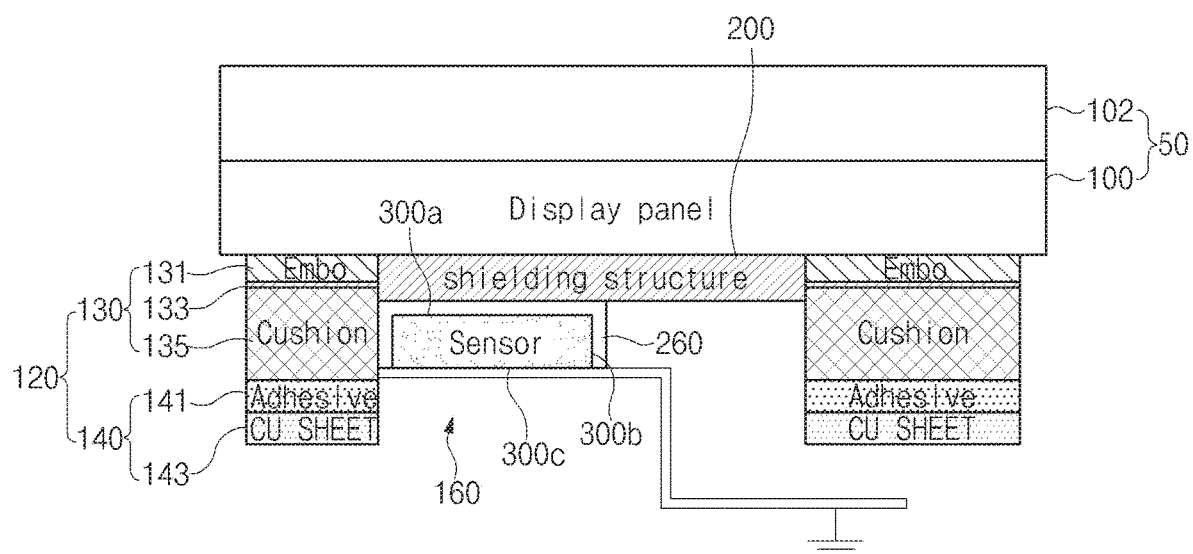
FIG. 7 is a sectional view of the electronic device including a shield-can according to various embodiments.
Figure 8:
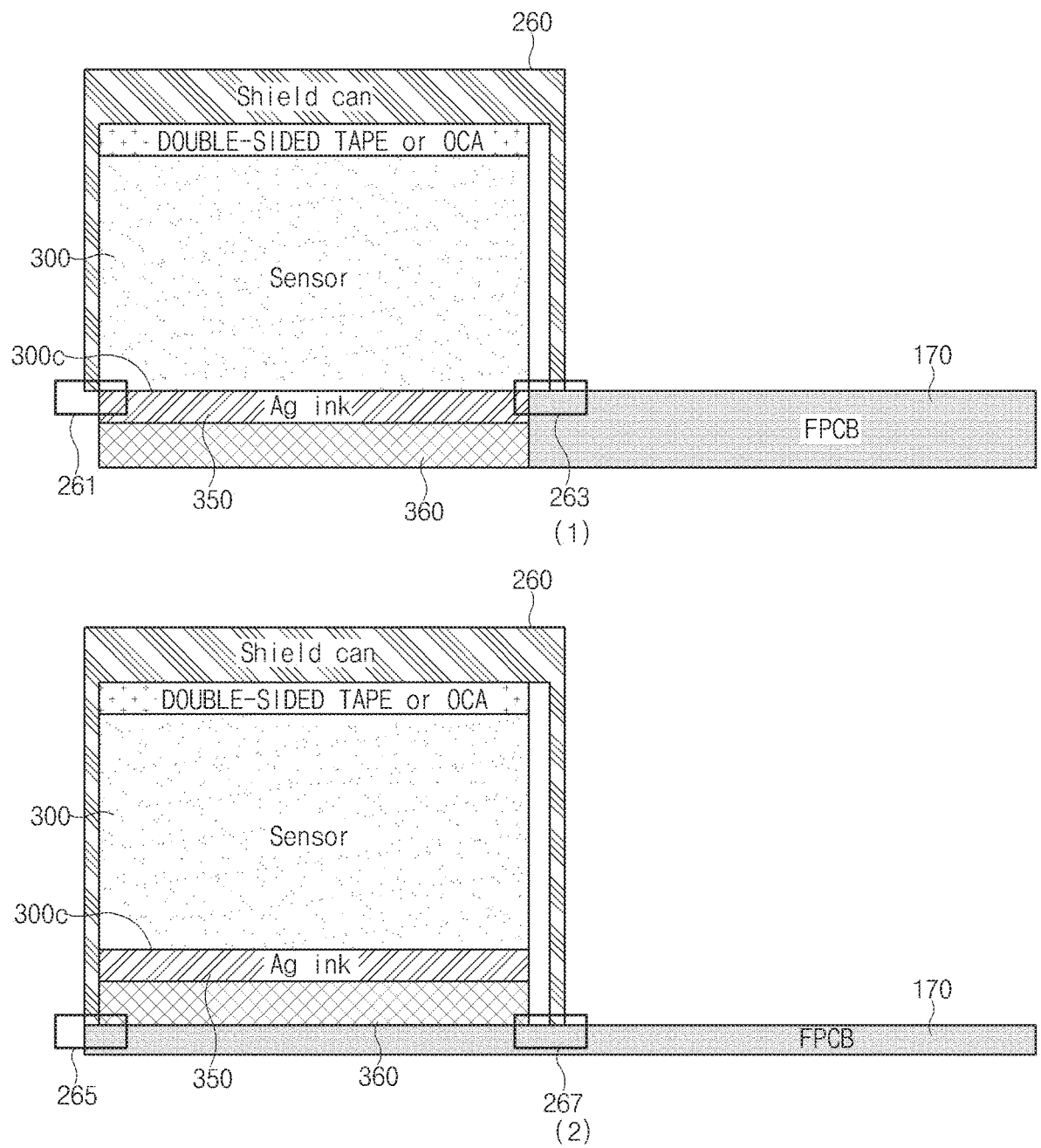
FIG. 8 illustrates structures of the shield-can according to various embodiments.

FIG. 7 is a sectional view of the electronic device including a shield-can according to various embodiments. FIG. 8 illustrates structures of the shield-can according to various embodiments.

Referring to FIGS. 7 and 8, the electronic device 10 according to various embodiments may further include the shield-can 260 containing a metallic material. The shield-can 260 may be formed to surround the ultrasonic sensor 300. The shield-can 260 may block noise of the display panel 100. For example, the shield-can 260 may contain a metallic material such as SUS, silver, copper, or the like. Alternatively, the shield-can 260 may be formed of an EMI shielding film (e.g., the EMI shielding film 400 of FIG. 5E).

In an embodiment, the ultrasonic sensor 300 may include a first surface 300a facing the display panel 100, a second surface 300c opposite to the first surface 300a, and side surfaces 300b surrounding a space between the first surface 300a and the second surface 300c. The shield-can 260 may be formed to surround the first surface 300a and the side surfaces 300b of the ultrasonic sensor 300.

In various embodiments, the shield-can 260, when mounted, may be combined with the shielding structure 200 having various structures.

For example, the shielding structure 200 may contain a black pigment, a material having a shrinkage of a predetermined value or less, and a conductive material (e.g., the shielding structure 200 of FIG. 2). The shielding structure 200 may prevent the inside of the electronic device 10 from being visible, may block noise of the display panel 100, and may prevent a flexural phenomenon during curing. In various embodiments, the shielding structure 200 may further contain an adhesive material (e.g., a thermosetting resin). Accordingly, the shield-can 260 may be attached to the bottom of the shielding structure 200.

In another example, the shielding structure 200 (e.g., the shielding structure 200 of FIG. 6) may include a first layer and a second layer. The first layer (e.g., the first layer 210 of FIG. 6) may contain a non-conductive black pigment. The second layer (e.g., the second layer 220 of FIG. 6) may include a double-sided tape or an optical clear adhesive (OCA). For example, the double-sided tape and the optical clear adhesive may be selected to have a shrinkage of less than about 1% to prevent a flexural phenomenon during curing. Alternatively, the second layer may contain a material having a shrinkage of a specified value or less and a material having adhesiveness. The second layer may cause the first layer and the shield-can 260 to be stuck together and may prevent a flexural phenomenon during curing.

In various embodiments, the shielding can 260 may be electrically connected with a ground area provided in the electronic device 10.

Referring to FIG. 8, the FPCB 170 on which a display driver IC (e.g., the display driver IC 110 of FIG. 2) is disposed may be formed to extend to the opening part 160 of the support structure 120 and connect to one end of the shield-can 260. The shield-can 260 may be electrically connected with a ground area of the FPCB 170.

In an embodiment, the electronic device 10 may further include a conductive layer 350 (e.g., a Ag ink) that is attached to the bottom of the second surface 300c of the ultrasonic sensor 300. The conductive layer 350 may be electrically connected with the ground area of the FPCB 170.

In an embodiment, ends 261, 263, 265, and 267 of the shield-can 260 may be electrically connected with the conductive layer 350 or the ground area of the FPCB 170.

Referring to (1) of FIG. 8, one end 261 of the shield-can 260 may be connected to the conductive layer 350, and another end 263 of the shield-can 260 may be connected to the FPCB 170. The FPCB 170 may extend to one end of the conductive layer 350. The FPCB 170 may be attached to the conductive layer 350 and a buffer member 360 to support the ultrasonic sensor 300 and other structures. For example, the buffer member 360 may be attached to the bottom of the conductive layer 350 and may absorb shock caused by vibration of the ultrasonic sensor 300.

Referring to (2) of FIG. 8, the ends 265 and 267 of the shield-can 260 may be connected to the FPCB 170. The FPCB 170 may extend to the bottom of the buffer member 360. The FPCB 170 may be attached to the bottom of the buffer member 360 to support the ultrasonic sensor 300 and other structures.

Figure 9:
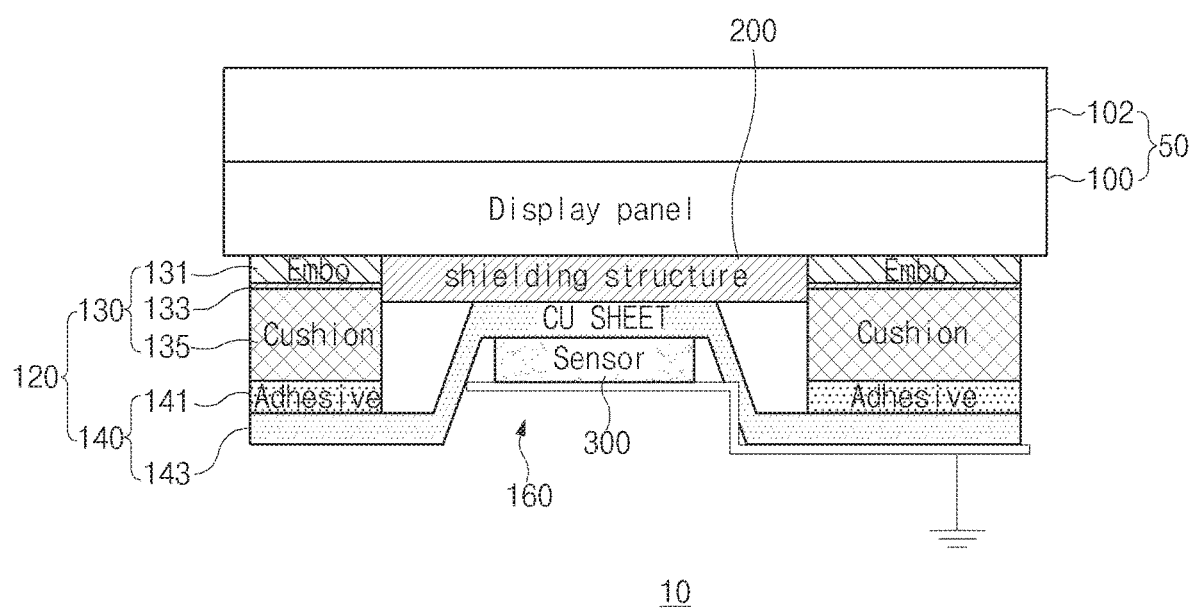
FIG. 9 is a sectional view of the electronic device in which a metal sub-layer of a support structure extends to perform a shielding function according to various embodiments.

FIG. 9 is a sectional view of the electronic device in which the metal sub-layer of the support structure extends to perform a shielding function according to various embodiments.

In various embodiments, the support structure 120 may include a plurality of sub-layers. The support structure 120 may include the embo sub-layer 131, the black coating sub-layer 133, the cushion sub-layer 135, the adhesive sub-layer 141, and the metal sub-layer 143.

In an embodiment, the metal sub-layer 143 included in the support structure 120 may be formed by extending to a space between the shielding structure 200 and the ultrasonic sensor 300. For example, the metal sub-layer 143 may be brought into contact with a lower surface of the shielding structure 200 and an upper surface of the ultrasonic sensor 300. The metal sub-layer 143 may block noise of the display panel 100.

In various embodiments, the extended metal sub-layer 143, when mounted, may be combined with the shielding structure 200 having various structures.

For example, the shielding structure 200 may contain a black pigment, a material having a shrinkage of a predetermined value or less, and a conductive material (e.g., the shielding structure 200 of FIG. 2). The shielding structure 200 may prevent the inside of the electronic device 10 from being visible, may block noise of the display panel 100, and may prevent a flexural phenomenon during curing. In various embodiments, the shielding structure 200 may further contain an adhesive material (e.g., a thermosetting resin). Accordingly, the metal sub-layer 143 may be attached to the bottom of the shielding structure 200.

In another example, the shielding structure 200 (e.g., the shielding structure 200 of FIG. 6) may include a first layer and a second layer. The first layer (e.g., the first layer 210 of FIG. 6) may contain a non-conductive black pigment. The second layer (e.g., the second layer 220 of FIG. 6) may include a double-sided tape or an optical clear adhesive (OCA). For example, the double-sided tape and the optical clear adhesive may be selected to have a shrinkage of less than about 1% to prevent a flexural phenomenon during curing. Alternatively, the second layer may contain a material having a shrinkage of a specified value or less and a material having adhesiveness. The second layer may cause the first layer and the metal sub-layer 143 to be stuck together and may prevent a flexural phenomenon during curing.

Figure 10:
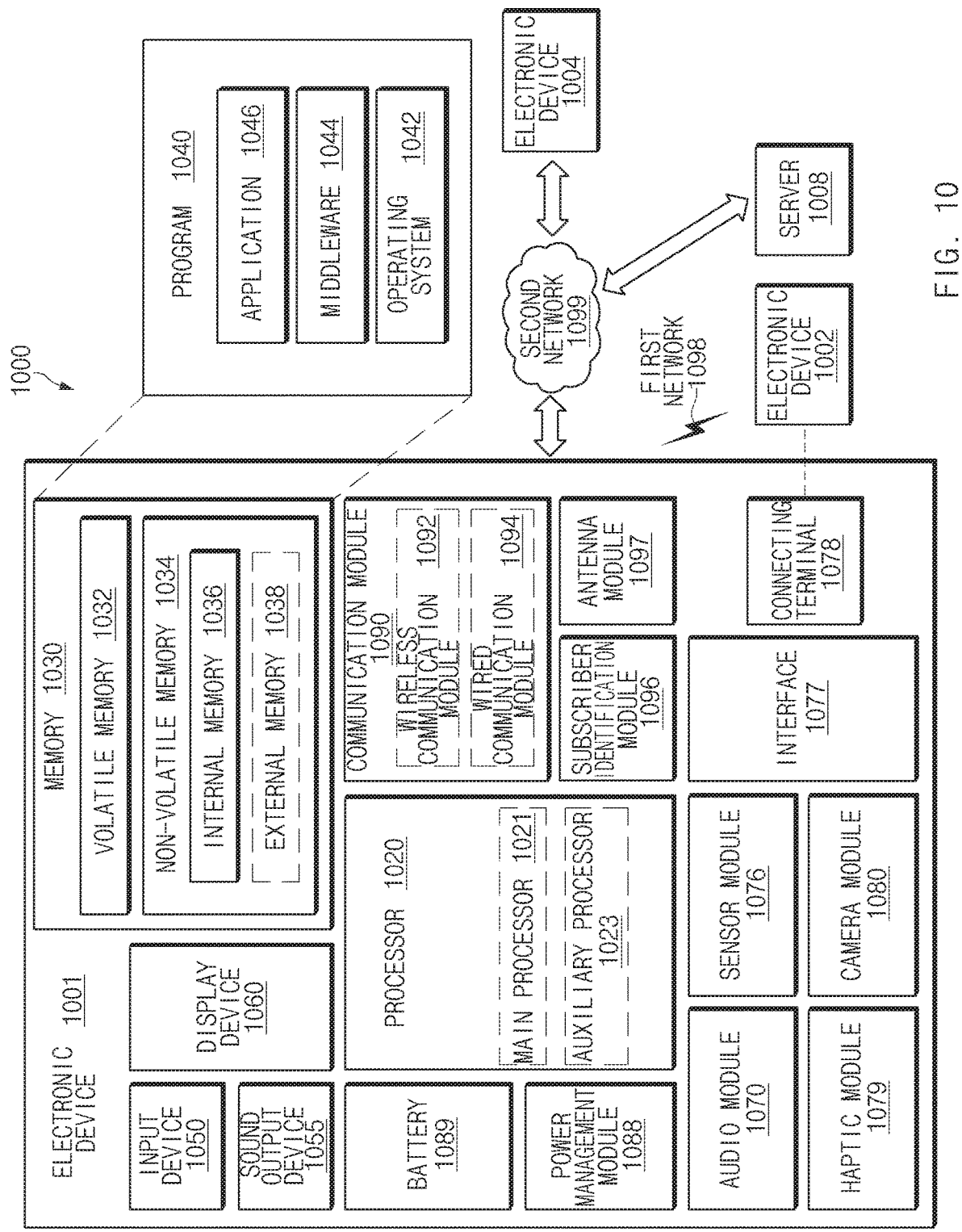
FIG. 10 is a block diagram illustrating an electronic device in a network environment according to various embodiments.

FIG. 10 is a block diagram illustrating an electronic device 1001 in a network environment 1000 according to various embodiments. Referring to FIG. 10, the electronic device 1001 (e.g., the electronic device 10 of FIG. 1) in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

In this case, the auxiliary processor 1023 may control, for example, at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, or a keyboard.

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound and an electrical signal in dual directions. According to an embodiment, the audio module 1070 may obtain the sound through the input device 1050 or may output the sound through an external electronic device (e.g., the electronic device 1002 (e.g., a speaker or a headphone)) wired or wirelessly connected to the sound output device 1055 or the electronic device 1001.

The sensor module 1076 may generate an electrical signal or a data value corresponding to an operating state (e.g., power or temperature) inside or an environmental state outside the electronic device 1001. The sensor module 1076 may include, for example, a gesture sensor, a gyro sensor, a barometric pressure sensor, a magnetic sensor, an accelera-tion sensor, a grip sensor, a proximity sensor, a color sensor, an infrared sensor, a biometric sensor, a temperature sensor, a humidity sensor, or an illuminance sensor.

The interface 1077 may support a designated protocol wired or wirelessly connected to the external electronic device (e.g., the electronic device 1002). According to an embodiment, the interface 1077 may include, for example, an HDMI (high-definition multimedia interface), a USB (universal serial bus) interface, an SD card interface, or an audio interface.

A connecting terminal 1078 may include a connector that physically connects the electronic device 1001 to the external electronic device (e.g., the electronic device 1002), for example, an HDMI connector, a USB connector, an SD card connector, or an audio connector (e.g., a headphone connector).

The haptic module 1079 may convert an electrical signal to a mechanical stimulation (e.g., vibration or movement) or an electrical stimulation perceived by the user through tactile or kinesthetic sensations. The haptic module 1079 may include, for example, a motor, a piezoelectric element, or an electric stimulator.

The camera module 1080 may shoot a still image or a video image. According to an embodiment, the camera module 1080 may include, for example, at least one lens, an image sensor, an image signal processor, or a flash.

The power management module 1088 may be a module for managing power supplied to the electronic device 1001 and may serve as at least a part of a power management integrated circuit (PMIC).

The battery 1089 may be a device for supplying power to at least one component of the electronic device 1001 and may include, for example, a non-rechargeable (primary) battery, a rechargeable (secondary) battery, or a fuel cell.

The communication module 1090 may establish a wired or wireless communication channel between the electronic device 1001 and the external electronic device (e.g., the electronic device 1002, the electronic device 1004, or the server 1008) and support communication execution through the established communication channel. The communication module 1090 may include at least one communication processor operating independently from the processor 1020 (e.g., the application processor) and supporting the wired communication or the wireless communication. According to an embodiment, the communication module 1090 may include a wireless communication module 1092 (e.g., a cellular communication module, a short-range wireless communication module, or a GNSS (global navigation satellite system) communication module) or a wired communication module 1094 (e.g., an LAN (local area network) communication module or a power line communication module) and may communicate with the external electronic device using a corresponding communication module among them through the first network 1098 (e.g., the short-range communication network such as a Bluetooth, a WiFi direct, or an IrDA (infrared data association)) or the second network 1099 (e.g., the long-distance wireless communication network such as a cellular network, an internet, or a computer network (e.g., LAN or WAN)). The above-mentioned various communication modules 1090 may be implemented into one chip or into separate chips, respectively.

According to an embodiment, the wireless communication module 1092 may identify and authenticate the electronic device 1001 using user information stored in the subscriber identification module 1096 in the communication network.

The antenna module 1097 may include one or more antennas to transmit or receive the signal or power to or from an external source. According to an embodiment, the communication module 1090 (e.g., the wireless communication module 1092) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1001 and the external electronic device 1004 through the server 1008 connected to the second network 1099. Each of the electronic devices 1002 and 1004 may be the same or different types as or from the electronic device 1001. According to an embodiment, all or some of the operations performed by the electronic device 1001 may be performed by another electronic device or a plurality of external electronic devices. When the electronic device 1001 performs some functions or services automatically or by request, the electronic device 1001 may request the external electronic device to perform at least some of the functions related to the functions or services, in addition to or instead of performing the functions or services by itself. The external electronic device receiving the request may carry out the requested function or the additional function and transmit the result to the electronic device 1001. The electronic device 1001 may provide the requested functions or services based on the received result as is or after additionally processing the received result. To this end, for example, a cloud computing, distributed computing, or client-server computing technology may be used.

Figure 11:
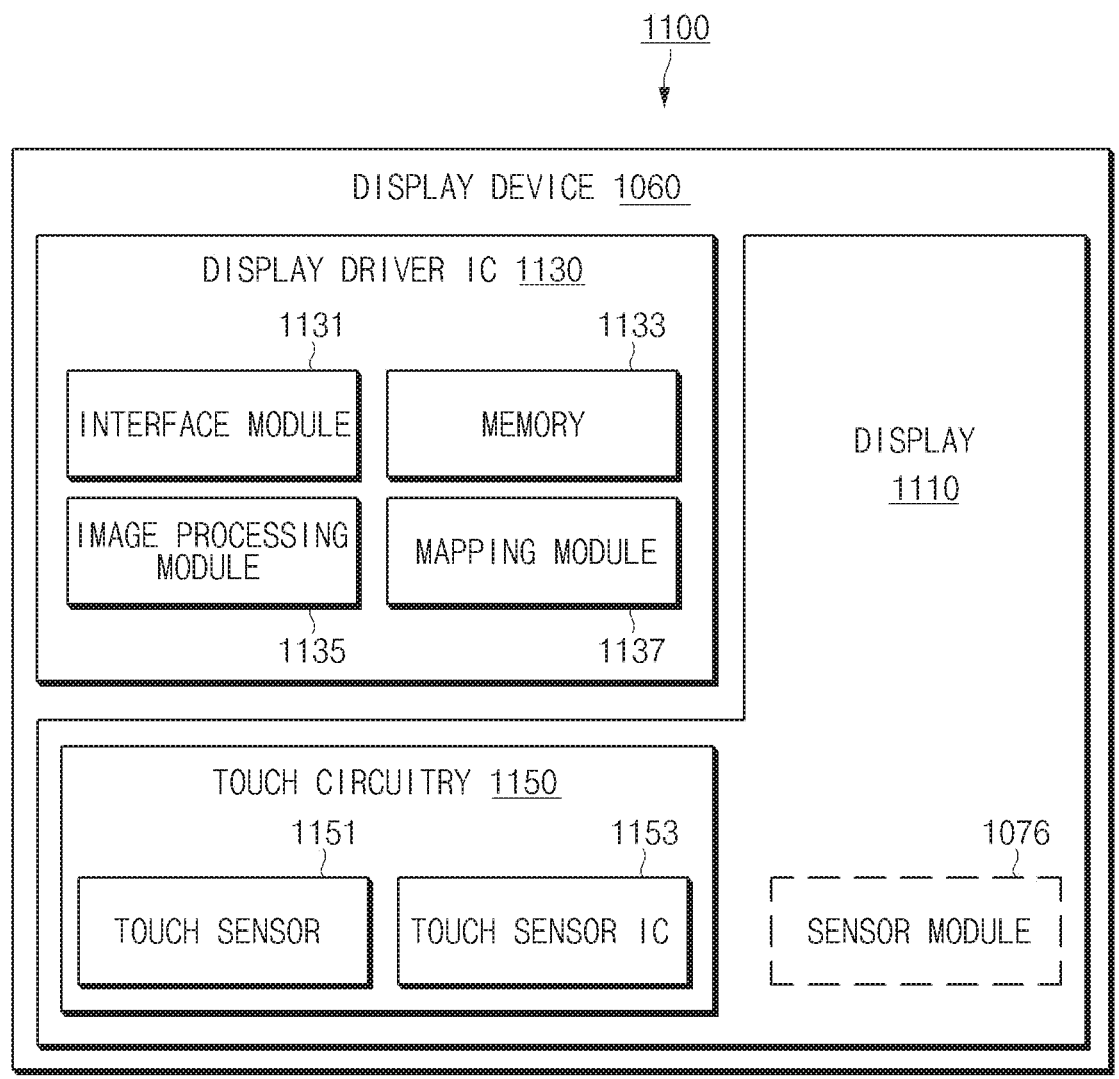
FIG. 11 is a block diagram of a display device according to various embodiments.

FIG. 11 is a block diagram 1100 of a display device 1060 according to various embodiments.

Referring to FIG. 11, the display device 1060 may include a display 1110 (e.g., the display 50 of FIG. 1) and a display driver IC (DDI) 1130 (e.g., the display driver IC 110 of FIG. 2) for controlling the display 1110. The DDI 1130 may include an interface module 1131, a memory 1133 (e.g., a buffer memory), an image processing module 1135, or a mapping module 1137. For example, the DDI 1130 may receive image information including image data or an image control signal corresponding to a command for controlling the image data from a processor 1020 (e.g., a main processor 1021 or an application processor) or an auxiliary processor 1023, which is operated independently of the main processor 1021, through the interface module 1131. The DDI 1130 may communicate with a touch circuit 1150, the sensor module 1076, or the like through the interface module 1131. In addition, the DDI 1130 may store at least a part of the received image information in the memory 1133, for example, in units of frames. For example, the image processing module 1135 may perform preprocessing or post-processing (e.g., adjustment of resolution, brightness, or size) on at least a part of the image data based at least partially on characteristics of the image data or the display 1110. The mapping module 1137 may convert the image data preprocessed or post-processed through the image processing module 1135 into a voltage value or a current value capable of driving the pixels, based at least partially on attributes of the pixels of the display 1110 (e.g., an array of pixels (RGB stripe or pentile) or a size of each of subpixels). For example, at least some pixels of the display 1110 may be driven based on the voltage or current value, such that visual information (e.g., a text, an image, or an icon) corresponding to the image data is displayed on the display 1110.

According to an embodiment, the display device 1060 may further include the touch circuit 1150. The touch circuit 1150 may include a touch sensor 1151 and a touch sensor IC 1153 for controlling the touch sensor 1151. The touch sensor IC 1153 may controls the touch sensor 1151 to measure, for example, a change in a signal (e.g., a voltage, a light amount, a resistance, or a charge amount) at a specific position of the display 1110 to sense a touch input or a hovering input, and may provide information (e.g., a location, an area, a pressure or a time) about the sensed touch input or hovering input to the processor 1020. According to an embodiment, at least a part (e.g., the touch sensor IC 1153) of the touch circuit 1150 may be included as a part of the display driver IC 1130 or the display 1110, or as a part of another component (e.g., the auxiliary processor 1023) arranged outside the display device 1060.

According to an embodiment, the display device 1060 may further include at least one sensor (e.g., a fingerprint sensor, an iris sensor, a pressure sensor or an illuminance sensor) of the sensor module 1076, or a control circuitry thereof. In this case, the at least one sensor or the control circuitry thereof may be embedded in a part (e.g., the display 1110 or the DDI 1130) of the display device 1060 or a part of the touch circuit 1150. For example, when the sensor module 1076 embedded in the display device 1060 includes a biometric sensor (e.g., a fingerprint sensor), the biometric sensor may obtain biometric information associated with a touch input through an area of the display 1110. As another example, when the sensor module 1076 embedded in the display device 1060 includes a pressure sensor, the pressure sensor may obtain information about a pressure corresponding to a touch input through an area or entire area of the display 1110. According to an embodiment, the touch sensor 1151 or the sensor module 1076 may be arranged between pixels of the pixel layer of the display 1110, or above or below the pixel layer.

An electronic device (e.g., the electronic device 10 of FIG. 1) according to an embodiment may include a display panel (e.g., the display panel 100 of FIG. 2) that includes a plurality of pixels, a display driver IC (e.g., the display driver IC 110 of FIG. 2) that is electrically connected with the display panel and that displays contents using the plurality of pixels, a support structure (e.g., the support structure 120 of FIG. 2) that is disposed under one surface of the display panel and that has an opening part (e.g., the opening part 160 of FIG. 2) formed therein through which a partial area of the one surface is exposed, a shielding structure (e.g., the shielding structure 200 of FIG. 2) that is disposed under at least part of the partial area of the display panel exposed through the opening part, the shielding structure being electrically connected with a ground area provided in the electronic device so as to block noise generated from the display panel driven by the display driver IC, and an ultrasonic sensor (e.g., the ultrasonic sensor 300 of FIG. 2) that is disposed under at least part of the shielding structure.

The electronic device according to an embodiment may further include an FPCB (e.g., the FPCB 170 of FIG. 4) that has the display driver IC disposed thereon, and the shielding structure may be electrically connected with the ground area of the FPCB.

The electronic device according to an embodiment may further include a connecting area (e.g., the connecting area 103 of FIG. 4) that extends from the display panel, the FPCB may be electrically connected with the connecting area, and the connecting area may be bent such that the FPCB is spaced apart from the display panel and the ultrasonic sensor.

The electronic device according to an embodiment may further include a shielding layer (e.g., the shielding layer 150 of FIG. 5B) that is disposed under the support structure to cover an opening of the opening part.

The shielding structure of the electronic device according to an embodiment may include an EMI shielding film (e.g., the EMI shielding film 400 of FIG. 5E).

The shielding structure of the electronic device according to an embodiment may contain a black pigment, a material having a shrinkage of a predetermined value or less, and a conductive material.

The ultrasonic sensor of the electronic device according to an embodiment may include a first surface (e.g., the first surface 300*a* of FIG. 7) that faces the display panel, a second surface (e.g., the second surface 300*c* of FIG. 7) that is opposite to the first surface, and side surfaces (e.g., the side surfaces 300*b* of FIG. 7) that surround a space between the first surface and the second surface, and the electronic device may further include a shield-can (e.g., the shield-can 260 of FIG. 7) that surrounds the first surface and the side surfaces of the ultrasonic sensor.

The electronic device according to an embodiment may further include a conductive layer (e.g., the conductive layer 350 of FIG. 8) that is attached under the second surface of the ultrasonic sensor and electrically connected with the ground area, and one end of the shield-can may be electrically connected with the conductive layer or the ground area.

The support structure of the electronic device according to an embodiment may include a metal layer (e.g., the metal sub-layer 143 of FIG. 9), and the metal layer may be formed by extending to a space between the shielding structure and the ultrasonic sensor and may be brought into contact with a lower surface of the shielding structure and an upper surface of the ultrasonic sensor.

The support structure of the electronic device according to an embodiment may include a plurality of sub-layers. The plurality of sub-layers may include a buffer sub-layer (e.g., the buffer sub-layer 130 of FIG. 5A) that is disposed under the display panel and a black coating sub-layer (e.g., the black coating sub-layer 133 of FIG. 5A) that is disposed inside the buffer sub-layer, and the shielding structure may be formed by being connected with the black coating sub-layer.

The shielding structure of the electronic device according to an embodiment may include a first layer (e.g., the first layer 210 of FIG. 6) that is disposed under the display panel and that contains a black pigment and a second layer (e.g., the second layer 220 of FIG. 6) that is disposed under the first layer.

The first layer of the electronic device according to an embodiment may contain a non-conductive black pigment, and the second layer may contain a material having a shrinkage of a predetermined value or less and a conductive material.

The first layer of the electronic device according to an embodiment may contain a non-conductive black pigment, and the second layer may contain an EMI shielding film The first layer of the electronic device according to an embodiment may contain a black pigment and a conductive material, and the second layer may contain a material having a shrinkage of a predetermined value or less or an optical clear resin (OCR).

The electronic device according to an embodiment may further include a shield-can (e.g., the shield-can 260 of FIG. 7) that surrounds the ultrasonic sensor, the first layer may contain a non-conductive black pigment, and the second layer may contain a non-conductive material having a shrinkage of a predetermined value or less, an optical clear adhesive, or a double-sided tape.

An electronic device (e.g., the electronic device 10 of FIG. 1) according to an embodiment may include a housing, a display panel (e.g., the display panel 100 of FIG. 2) that is disposed in the housing and that includes a plurality of pixels, a support structure (e.g., the support structure 120 of FIG. 2) that is disposed under the display panel and that has an opening part (e.g., the opening part 160 of FIG. 2) that is formed in a partial area thereof, an ultrasonic sensor that transmits and receives an ultrasonic signal passing through the display panel, a shielding structure (e.g., the shielding structure 200 of FIG. 2) that is disposed in the opening part and is disposed between the display panel and the ultrasonic sensor and that contains a conductive material, and a ground area provided in the housing. The shielding structure may be electrically connected with the ground area.

The electronic device according to an embodiment may further include a connecting area (e.g., the connecting area 103 of FIG. 4) that extends from the display panel and an FPCB (e.g., the FPCB 170 of FIG. 4) on which the display driver IC is disposed and that is electrically connected with the connecting area. The connecting area may be bent such that the FPCB is spaced apart from the display panel and the ultrasonic sensor, and the shielding structure may be electrically connected with the ground area of the FPCB.

The electronic device according to an embodiment may further include a shielding layer (e.g., the shielding layer 150 of FIG. 5B) that is disposed under the support structure to cover an opening of the opening part.

The shielding structure of the electronic device according to an embodiment may include, below the display panel, a thin layer (e.g., the black pigment layer 103 of FIG. 5C) that absorbs external light incident through the display panel.

The support structure of the electronic device according to an embodiment may include a plurality of sub-layers. The plurality of sub-layers may include a buffer sub-layer (e.g., the buffer sub-layer 130 of FIG. 5A) that is disposed under the display panel and a black coating sub-layer (e.g., the black coating sub-layer 133 of FIG. 5A) that is disposed inside the buffer sub-layer, and the shielding structure may be formed by being connected with the black coating sub-layer.

An electronic device (e.g., the electronic device 10 of FIG. 1) according to an embodiment may include a display panel (e.g., the display panel 100 of FIG. 2) that includes at least one pixel, a conductive member (e.g., the second layer 220 of FIG. 6) that is disposed under the display panel and that blocks noise generated from the display panel in relation to driving of the at least one pixel, a biometric sensor (e.g., the ultrasonic sensor 300 of FIG. 1) that is disposed under the conductive member, and a thin layer (e.g., the first layer 210 of FIG. 6) that absorbs external light incident through the display panel. The thin layer may be disposed between the display panel and the conductive member.

The electronic device according to an embodiment may further include a support structure (e.g., the support structure 120 of FIG. 6) that is disposed under the display panel and that has an opening part formed therein through which a partial area of one surface of the display panel is exposed, and the conductive member and the biometric sensor may be disposed in the opening part of the support structure.

The electronic device according to an embodiment may further include a shielding layer (e.g., the shielding layer 150 of FIG. 6) that is disposed under the support structure to cover an opening of the opening part.

The thin layer of the electronic device according to an embodiment may contain a black pigment.

The support structure of the electronic device according to an embodiment may include a black coating layer, and the thin layer may be formed by being connected with the black coating layer.

The electronic device according to various embodiments disclosed in the disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be understood that various embodiments of the disclosure and terms used in the embodiments do not intend to limit technologies disclosed in the disclosure to the particular forms disclosed herein; rather, the disclosure should be construed to cover various modifications, equivalents, and/or alternatives of embodiments of the disclosure. With regard to description of drawings, similar components may be assigned with similar reference numerals. As used herein, singular forms may include plural forms as well unless the context clearly indicates otherwise. In the disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the disclosure may be implemented by software (e.g., the program 1040) including an instruction stored in a machine-readable storage media (e.g., an internal memory 1036 or an external memory 1038) readable by a machine (e.g., a computer). The machine may be a device that calls the instruction from the machine-readable storage media and operates depending on the called instruction and may include the electronic device (e.g., the electronic device 1001). When the instruction is executed by the processor (e.g., the processor 1020), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the disclosure may be executed sequentially, in parallel, repeatedly, or in a heuristic method. Also, at least some operations may be executed in different sequences, omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a display panel including a plurality of pixels;
   a display driver IC electrically connected with the display panel and configured to display contents using the plurality of pixels;
   a support structure disposed under one surface of the display panel, the support structure having an opening part formed therein through which a partial area of the one surface is exposed;
   a shielding structure disposed under at least part of the partial area of the display panel exposed through the opening part, the shielding structure being electrically connected with a ground area provided in the electronic device so as to block noise generated from the display panel driven by the display driver IC; and
   an ultrasonic sensor disposed under at least part of the shielding structure.

2. The electronic device of claim 1, further comprising:
   an FPCB having the display driver IC disposed thereon, wherein the shielding structure is electrically connected with the ground area of the FPCB.

3. The electronic device of claim 1, further comprising:
   a shielding layer disposed under the support structure to cover an opening of the opening part.

4. The electronic device of claim 1, wherein the shielding structure contains a black pigment, a material having a shrinkage of a predetermined value or less, and a conductive material.

5. The electronic device of claim 1,
wherein the ultrasonic sensor includes a first surface configured to face the display panel, a second surface opposite to the first surface, and side surfaces configured to surround a space between the first surface and the second surface, and
wherein the electronic device further comprises a shield-can configured to surround the first surface and the side surfaces of the ultrasonic sensor.

6. The electronic device of claim 5, further comprising:
a conductive layer attached under the second surface of the ultrasonic sensor and electrically connected with the ground area,
wherein one end of the shield-can is electrically connected with the conductive layer or the ground area.

7. The electronic device of claim 1,
wherein the support structure includes a metal layer, and
wherein the metal layer is formed by extending to a space between the shielding structure and the ultrasonic sensor and is brought into contact with a lower surface of the shielding structure and an upper surface of the ultrasonic sensor.

8. The electronic device of claim 1,
wherein the support structure includes a plurality of sub-layers,
wherein the plurality of sub-layers include a buffer sub-layer disposed under the display panel and a black coating sub-layer disposed inside the buffer sub-layer, and
wherein the shielding structure is formed by being connected with the black coating sub-layer.

9. The electronic device of claim 1, wherein the shielding structure includes:
a first layer disposed under the display panel and containing a black pigment; and
a second layer disposed under the first layer.

10. The electronic device of claim 9,
wherein the first layer contains a non-conductive black pigment, and
wherein the second layer contains a material having a shrinkage of a predetermined value or less and a conductive material.

11. The electronic device of claim 9,
wherein the first layer contains a black pigment and a conductive material, and
wherein the second layer contains a material having a shrinkage of a predetermined value or less or an optical clear resin (OCR).

12. The electronic device of claim 9, further comprising:
a shield-can configured to surround the ultrasonic sensor,
wherein the first layer contains a non-conductive black pigment, and
wherein the second layer contains a non-conductive material having a shrinkage of a predetermined value or less, an optical clear adhesive, or a double-sided tape.

13. An electronic device comprising:
a housing;
a display panel disposed in the housing, the display panel including a plurality of pixels;
a support structure disposed under the display panel, the support structure having an opening part formed in a partial area thereof;
an ultrasonic sensor configured to transmit and receive an ultrasonic signal passing through the display panel;
a shielding structure disposed in the opening part, the shielding structure being disposed between the display panel and the ultrasonic sensor, wherein the shielding structure contains a conductive material; and
a ground area provided in the housing,
wherein the shielding structure is electrically connected with the ground area.

14. The electronic device of claim 13, further comprising:
a shielding layer disposed under the support structure to cover an opening of the opening part.

15. The electronic device of claim 13, wherein the shielding structure includes, below the display panel, a thin layer configured to absorb external light incident through the display panel.

* * * * *